(12) United States Patent
Lee et al.

(10) Patent No.: US 7,233,106 B2
(45) Date of Patent: Jun. 19, 2007

(54) LED CHIP CAPPING CONSTRUCTION

(75) Inventors: Ming-Shun Lee, Taipei (TW); Ping-Ru Sung, Taipei (TW)

(73) Assignee: Taiwan Oasis Technology Co., Ltd., Taipei (TW)

( * ) Notice: Subject to any disclaimer, the term of this patent is extended or adjusted under 35 U.S.C. 154(b) by 211 days.

(21) Appl. No.: 10/890,098

(22) Filed: Jul. 14, 2004

(65) Prior Publication Data

US 2006/0012297 A1    Jan. 19, 2006

(51) Int. Cl.
*H05B 33/00* (2006.01)
(52) U.S. Cl. .................................................... 313/512
(58) Field of Classification Search ............... 313/512
See application file for complete search history.

(56) References Cited

U.S. PATENT DOCUMENTS

| | | | | |
|---|---|---|---|---|
| 4,603,496 | A  * | 8/1986 | Latz et al. ..................... | 40/547 |
| 5,140,220 | A  * | 8/1992 | Hasegawa ..................... | 313/512 |
| 6,759,803 | B2 * | 7/2004 | Sorg ............................. | 313/512 |
| 6,850,001 | B2 * | 2/2005 | Takekuma ..................... | 313/501 |

* cited by examiner

*Primary Examiner*—Joseph Williams
(74) *Attorney, Agent, or Firm*—Troxell Law Office, PLLC

(57) ABSTRACT

An LED chip capping construction to enhance luminance of the LED containing a condenser capping over a chip of the LED; a condensing part of the condenser protruding through a carrier and surrounded by multiple condensing aspects; the source light from the chip passing the condenser and consistently reflected to each condensing aspect due to the medium characteristics of the condenser.

8 Claims, 7 Drawing Sheets

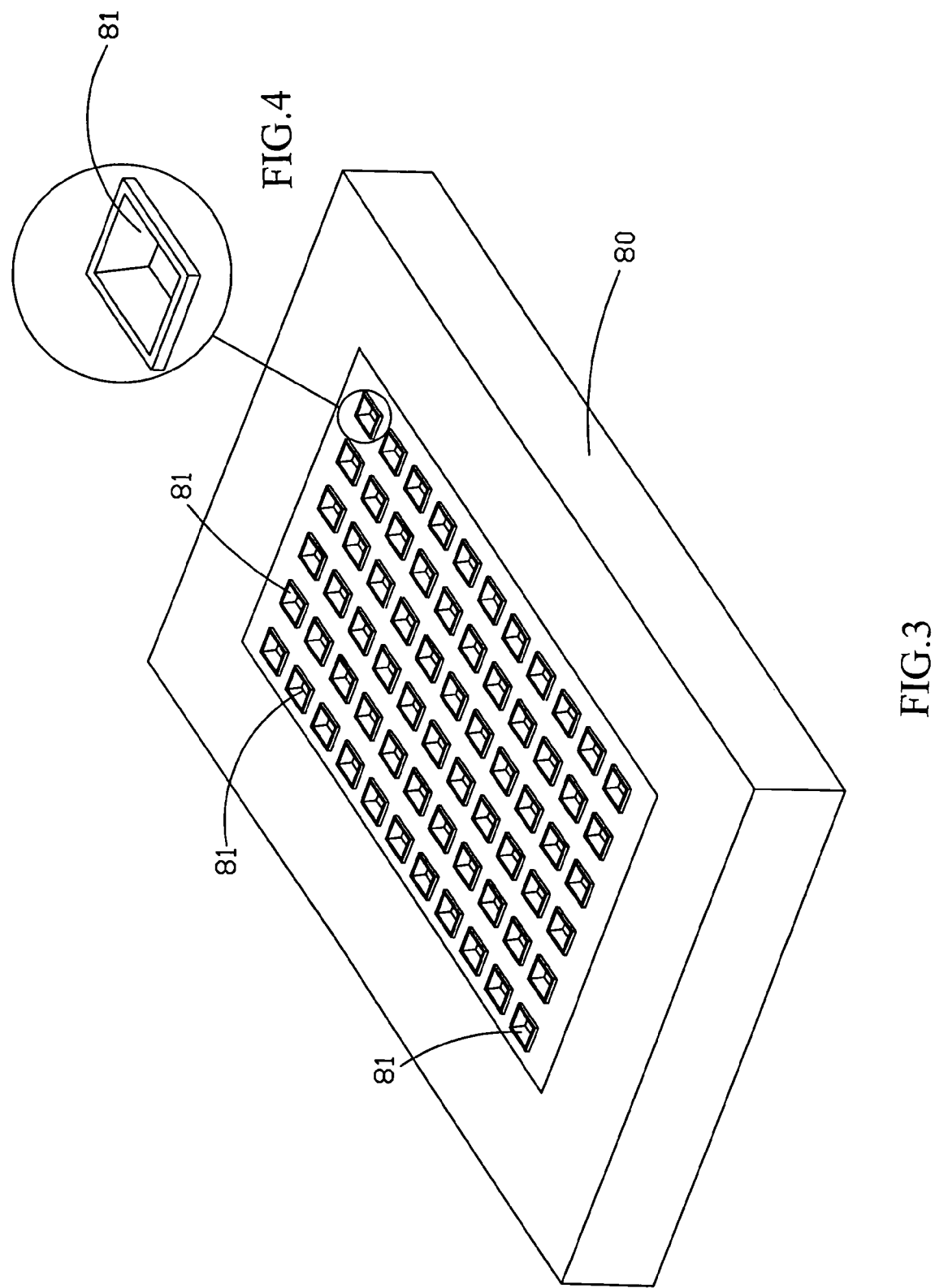

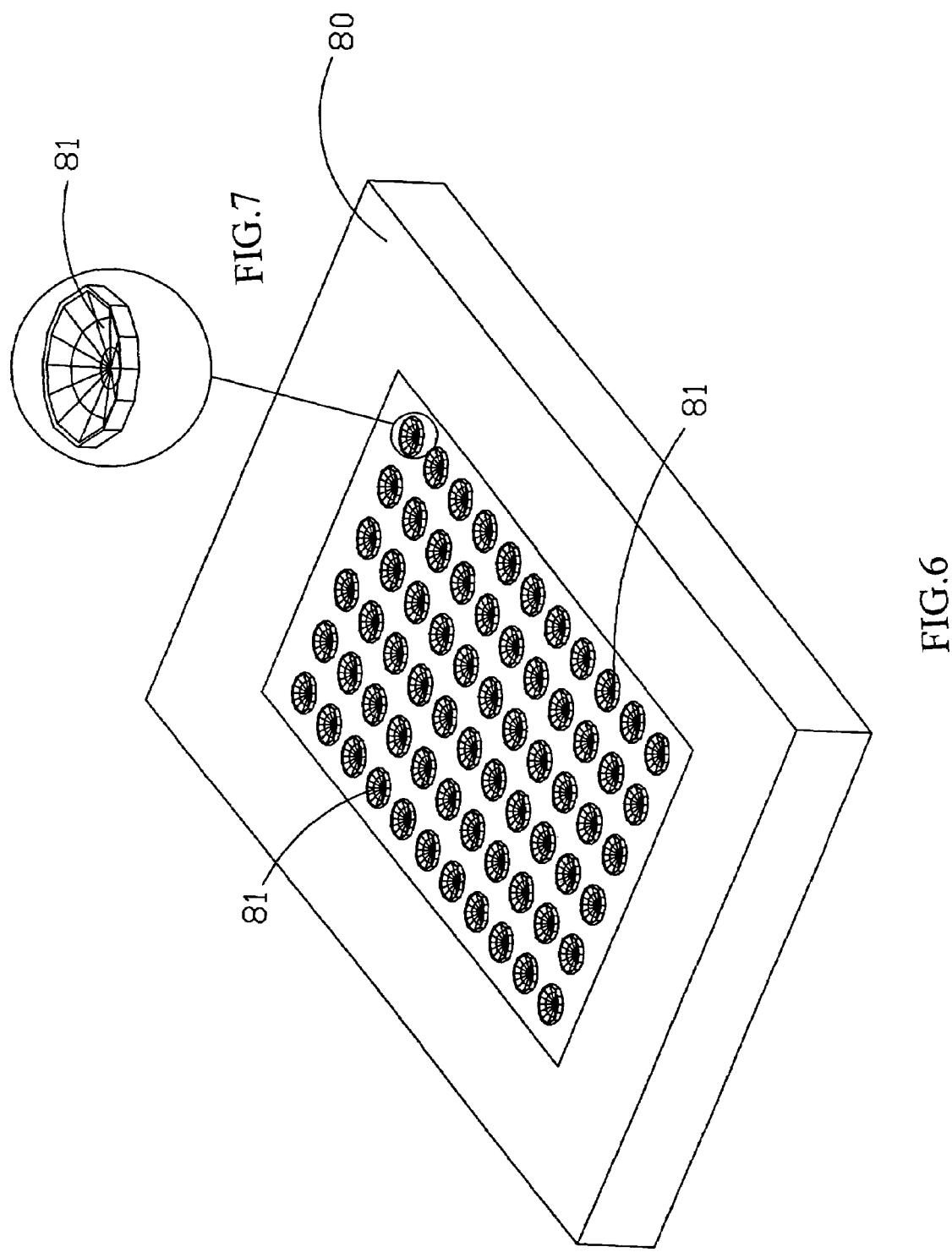

LED CHIP CAPPING CONSTRUCTION

BACKGROUND OF THE INVENTION (a) Field of the Invention

The present invention is related to an improved construction of a light emitting diode (LED), and more particularly, to one of chip capping construction to enhance LED luminance (b) Description of the Prior Art The LED generally available in the market for giving features of being compact, low power consumption, lower heat generated and longer service life have been gradually exiting the conventional tungsten lamps in the adaptation to commodities such as Christmas decoration lights, flash lights, vehicle signal lamps, and traffic signs. The LED as illustrated in FIG. 1 of the accompanying drawings is essentially comprised of a see-three packaging 10 containing conductors 20 of different polarities and a carrier 30. A chip is fixed to the carrier, and a golden plated wire 50 connects an electrode layer 41 of the chip to the conductor 40 while each conductor 20 extends out of the transparent packaging 10 to serve as a contact to the power source.

Accordingly, when the conductor 20 is conducted, the light source generated by the chip 40 emits the light. A fluorescent material 60 may be provided to the peripheral of the chip 40 so that when the light source generated from the chip 40 penetrates the fluorescent material 60, the wave length of the source light is incorporated with that of the fluorescence material 60 to produce the light color expected.

With improved manufacturing process and workmanship, the LED may be designed to emit a specific light color depending on the type of fluorescent material used to further expand the application range of the LED in the market. However, current R&D efforts for the LED are essentially invested in the color performance results and the increase of the production capacity of the LED. Therefore, there has been so far the absence of seeing any breakthrough in enhancing the luminance of the LED.

SUMMARY OF THE INVENTION

The primary purpose of the present invention is to provide an improved construction of the chip capping of the LED to enhance the luminance of the LED. To achieve the purpose, a condenser is capped over the chip of the LED and surrounded by multiple condensing aspects so that when the source light from the chip passes through the condenser, the source light is consistently reflected to each condensing aspect thanks to the medium characteristics of the condenser to enhance the luminance of the LED.

BRIEF DESCRIPTION OF THE DRAWINGS

FIG. 3 is a view showing the appearance of a molding of a condenser in the first preferred embodiment of the present invention.

FIG. 4 is a view showing the appearance of multiple cavities of the first preferred embodiment of the present invention.

FIG. 6 is a view showing the appearance of a molding of a condenser in the second preferred embodiment of the present invention.

FIG. 7 is a view showing the appearance of multiple cavities of the second preferred embodiment of the present invention.

DETAILED DESCRIPTION OF THE PREFERRED EMBODIMENTS

Figure 1:
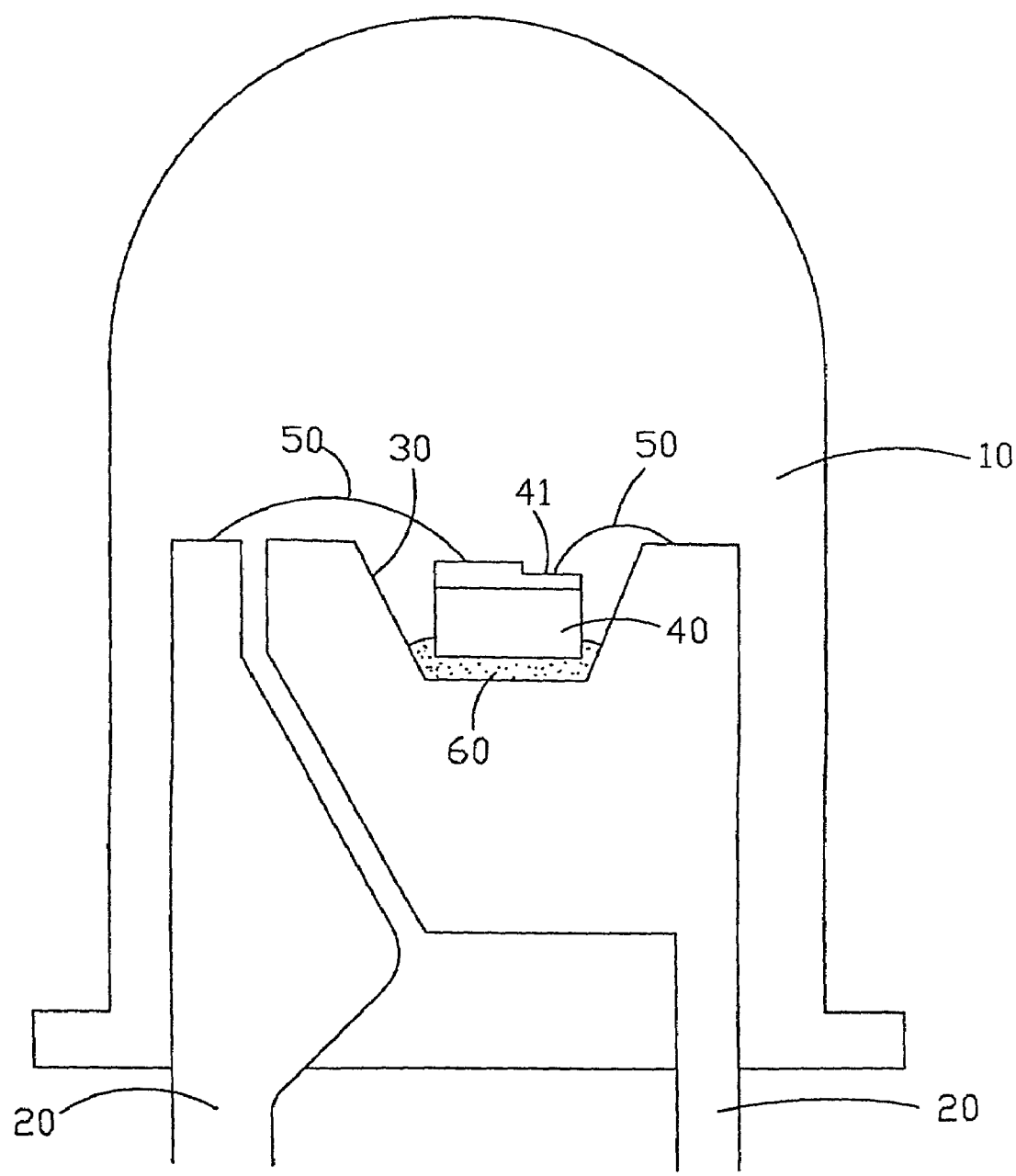
FIG. 1 is a schematic view showing a construction of a light emitting diode of the prior art.
Figure 2:
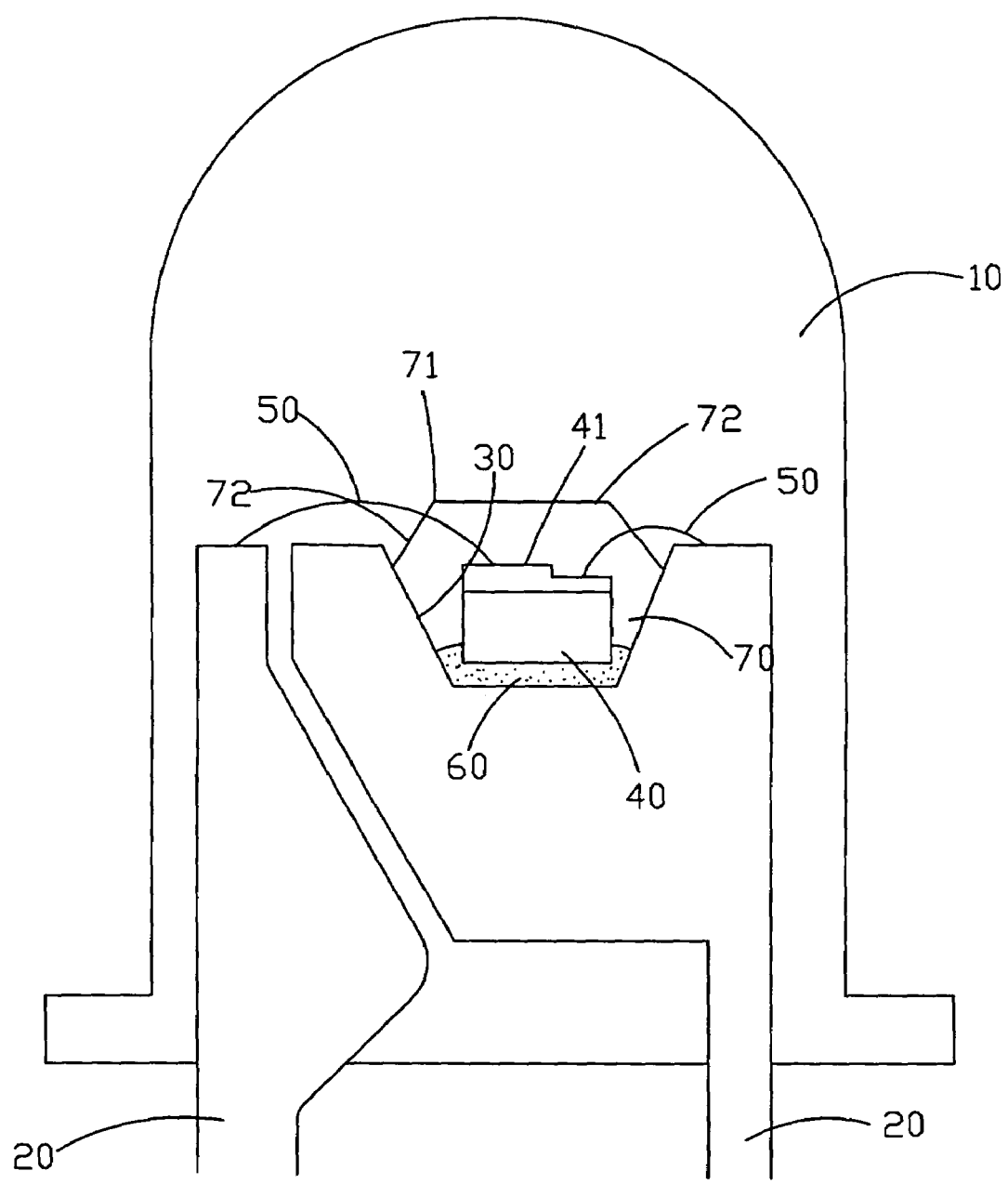
FIG. 2 is a schematic view showing an LED construction of a first preferred embodiment of the present invention.

Referring to FIG. 2, a construction of a chip capping of an LED is comprised of a transparent packaging 10 containing conductors 20 of different polarities and a carrier 30. The carrier 30 contains a chip 40 and the conductor 20 is connected to the electrode layer 41 of the chip 40 by a golden plated wire 50. Each conductor 20 extends out of the transparent packaging 10 to serve as a contact for the power supply.

In a first preferred embodiment of the present invention, a fluorescent material 60 is fixed to the carrier 30. The fluorescent material 60 may be provided in the form of a mixture of the chip adhesion material and fluorescent powder. In the manufacturing process, the fluorescent material 60 is coated at where between the chip 40 and the carrier 30 so to directly attach the chip 40 to the bottom of the carrier 30. Once the fluorescent is hardened, the base of the chip 40 is buried in the fluorescent material 60. Therefore, when the conductor 60 is conducted, the light generated from the chip 40 passes through the fluorescent material 60, wherein, the wave length of the source light is incorporated with that of the fluorescent material 60 to emit the light color expected.

A condenser 70 is capped over the chip 40 of the LED. A condensing part 71 of the condenser 70 protrudes through the carrier 30. The entire condensing part 71 is surrounded by multiple condensing aspects 72. As illustrated in FIG. 2, the condensing part 71 of the condenser 70 is made in a shape indicating a taper. A molding 80 is prepared as illustrated in FIG. 3 and the molding 80 contains those multiple cavities 81 as illustrated in FIG. 4. Once all the devices including the chip and the golden plated wire have been set, the carrier mounted with the chip is put upside down to be filled with the epoxy cavities and the epoxy when hardened becomes the condenser.

Accordingly, as illustrated in FIG. 2, the source light of the chip passing through the condenser is consistently reflected to each condensing aspect 72 thanks to the medium characteristics of the condenser 70 to enhance the luminance of the LED. Fluorescent material can be added into the condenser 70 to enhance the light color performance of the LED to avoid from creating diaphragm in strange color.

Figure 5:
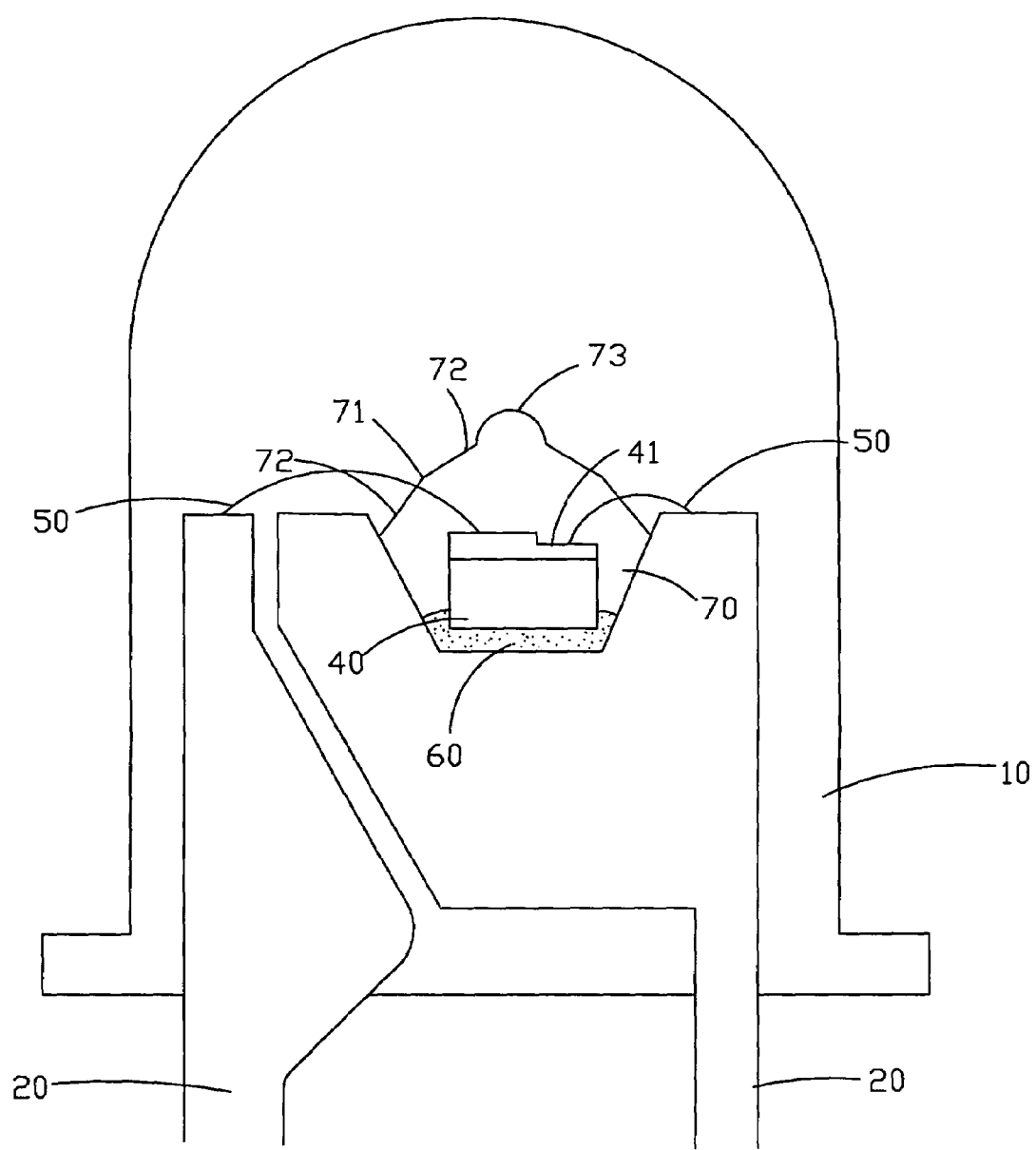
FIG. 5 is a schematic view showing an LED construction of a second preferred embodiment of the present invention.

As illustrated in FIG. 5, the condensing part 71 of the condenser 70 in a second preferred embodiment of the present invention indicates a mushroom shape formed using a molding and those cavities respectively illustrated in FIGS. 6 and 7. A spherical surface 73 is provided on the top of the condensing part 71 to help upgrade the light condensing results.

Figure 8:
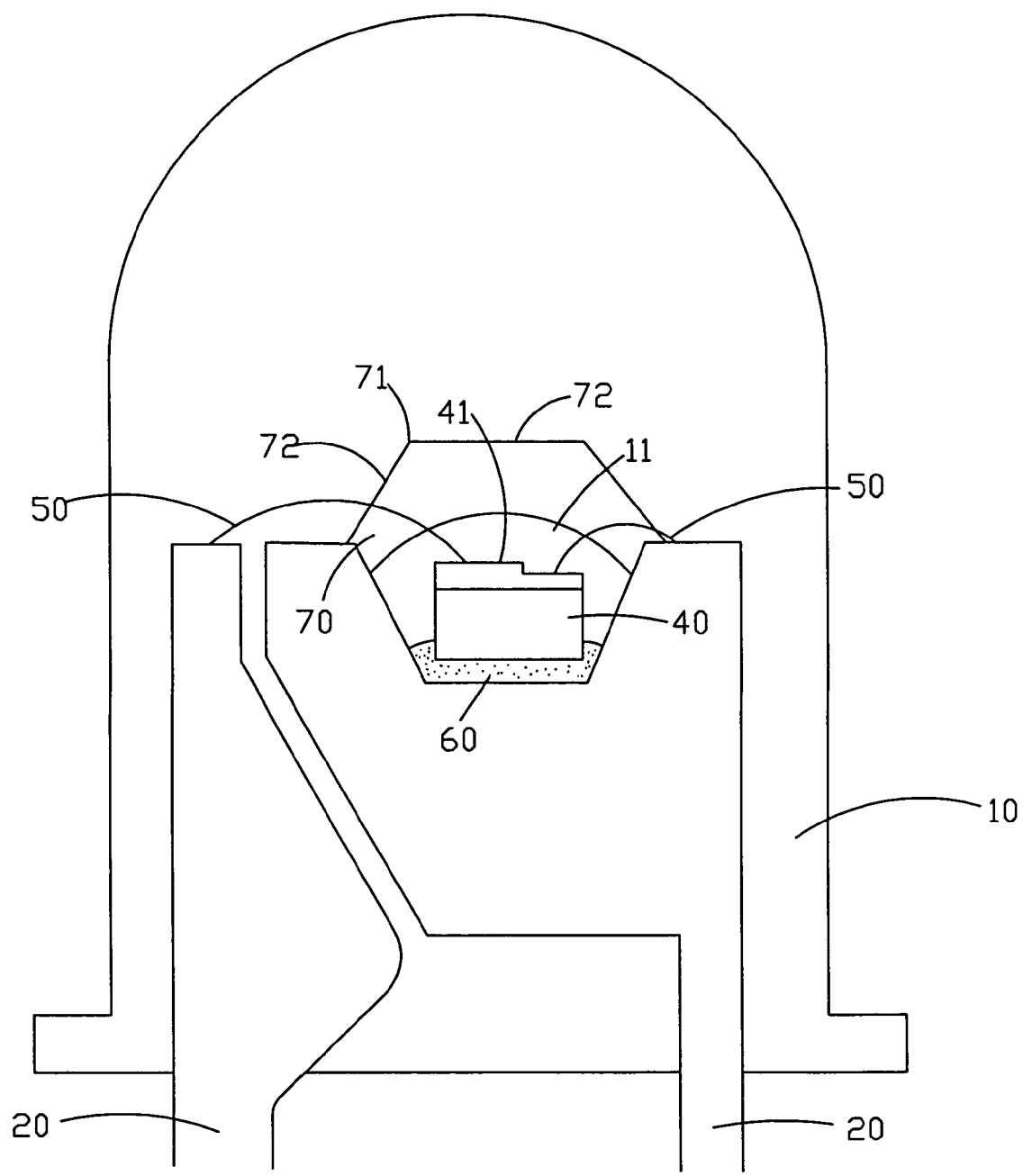
FIG. 8 is a schematic view showing an LED construction of a third preferred embodiment of the present invention.

When the condensing part is molded into the taper or the mushroom shape using those cavities 81, the carrier 30 is put upside down to plant is the chip into the cavity. Transparent insulation glue is applied first over the chip to hold the chip and the golden plated wire in place to provide a transparent separator 11 between the condenser 70 and the chip to improve the protection for the chip 40 as illustrated in FIG. 8 for a third preferred embodiment of the present invention.

Figure 9:
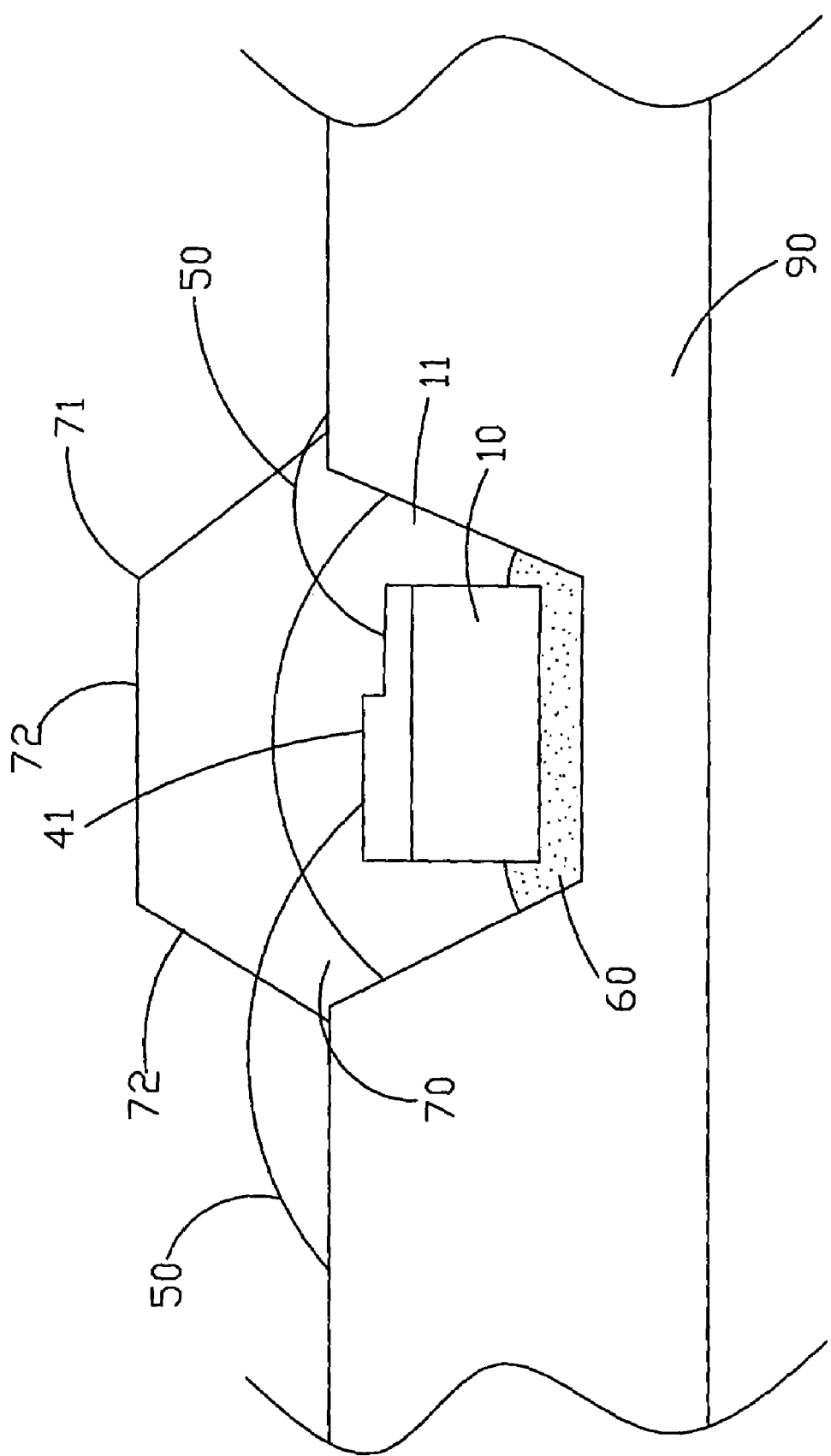
FIG. 9 is a schematic view showing an LED construction of a fourth preferred embodiment of the present invention.

Now referring to FIG. 9 for a fourth preferred embodiment of the present invention, the LED is directly constructed on a circuit board 90. A recessed carrier 30 is preset on the circuit board 90 with the chip 40 adapted to the bottom of the carrier 30 and capped with the transparent separator 11 and the condenser 70. The golden plated wire 50 connects the electrode layer 41 of the chip 40 and each of the conductors (not illustrated), and each conductor may be directly arranged on the contact on the circuit board to complete the LED being directly constructed on the circuit board 90.

The present invention for providing an improved construction of the chip capping for an LED to significantly enhance the luminance of the LED, this application for a utility patent is duly filed. However, it is to be noted that that those preferred embodiments disclosed in the specification and the accompanying drawings are in no way limiting the present invention. Therefore, any construction, installation, or characteristics that is same or similar to that of the present invention should fall within the scope of the purposes and claims of the present invention.

We claim:

1. An LED chip capping structure enhancing luminance of an LED, the LED chip capping structure comprising:
   a) a circuit board having a carrier recessed in a surface thereof;
   b) a chip fixed in the carrier of the circuit board and having an electrode layer;
   c) two golden plated wires connecting the electrode layer of the chip to the circuit board; and
   d) a condenser covering the chip and having:
      i) a condensing part protruding outwardly above the carrier; and
      ii) a plurality of condensing aspects surrounding the condensing part and reflecting a light source emitted by the chip.

2. The LED chip capping structure according to claim 1, further comprising a transparent package covering the condenser, the chip, and the carrier.

3. The LED chip capping structure according to claim 1, wherein the condensing part of the condenser has a tapered shape.

4. The LED chip capping structure according to claim 1, wherein the condensing part of the condenser has a shape of a mushroom, and the condensing part has a spherical surface located on a top thereof.

5. The LED chip capping structure according to claim 1, wherein the carrier contains fluorescent material.

6. The LED chip capping structure according to claim 1, wherein a transparent separator is provided between the condenser and the chip, and the carrier contains a fluorescent material.

7. The LED chip capping structure according to claim 1, wherein the carrier is connected to the chip by a fluorescent material including a chip adhesion material mixed with a fluorescent powder.

8. The LED chip capping structure according to claim 1, wherein the condenser contains a fluorescent material.

* * * * *